US009681589B1

(12) United States Patent
Ross et al.

(10) Patent No.: US 9,681,589 B1
(45) Date of Patent: Jun. 13, 2017

(54) PHASE CHANGE MATERIAL-BASED DATA CENTER COOLING SYSTEM

(71) Applicants: Peter G. Ross, Olympia, WA (US); James R. Hamilton, Seattle, WA (US); Michael P. Czamara, Seattle, WA (US)

(72) Inventors: Peter G. Ross, Olympia, WA (US); James R. Hamilton, Seattle, WA (US); Michael P. Czamara, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 773 days.

(21) Appl. No.: 13/626,711

(22) Filed: Sep. 25, 2012

(51) Int. Cl.
*H05K 7/20* (2006.01)

(52) U.S. Cl.
CPC ........... *H05K 7/208* (2013.01); *H05K 7/2029* (2013.01)

(58) Field of Classification Search
None
See application file for complete search history.

(56) References Cited

U.S. PATENT DOCUMENTS

| | | | |
|---|---|---|---|
| 6,170,561 B1 | 1/2001 | O'Grady | |
| 7,489,509 B2 * | 2/2009 | Keenan et al. | 361/700 |
| 7,505,269 B1 * | 3/2009 | Cosley et al. | 361/700 |
| 7,760,502 B2 | 7/2010 | Meyer, III et al. | |
| 8,053,748 B2 | 11/2011 | Shah et al. | |
| 8,760,855 B2 * | 6/2014 | Howes et al. | 361/677 |
| 2005/0174733 A1 * | 8/2005 | Novotny | 361/695 |
| 2008/0084666 A1 * | 4/2008 | Kehl et al. | 361/700 |
| 2009/0086434 A1 * | 4/2009 | Hodes et al. | 361/700 |
| 2010/0091447 A1 * | 4/2010 | Jaggers et al. | 361/679.47 |
| 2010/0154448 A1 * | 6/2010 | Hay | G06F 1/20 62/175 |
| 2011/0083827 A1 * | 4/2011 | Salyer | 165/104.14 |
| 2013/0125486 A1 | 5/2013 | Curtin et al. | |

\* cited by examiner

*Primary Examiner* — Courtney Smith
(74) *Attorney, Agent, or Firm* — Robert C. Kowert; Meyertons, Hood, Kivlin, Kowert & Goetzel, P.C.

(57) ABSTRACT

A data center includes an air handling system and a thermal energy receptacle system. The air handling system moves air across heat producing components of electrical systems in the data center. The thermal energy receptacle system is coupled to the air handling system. The thermal energy receptacle system includes one or more heat exchangers that exchange heat between air moving through the air handling system and a fluid, one or more phase change material modules including phase change material, and a fluid transport system that transports fluid between the phase change material modules and the heat exchangers. The thermal energy receptacle system transfers heat from air passing over the one or more heat exchangers to at least one of the phase change material modules such that at least a portion of the phase change material changes phase.

31 Claims, 7 Drawing Sheets

FIG. 7

PHASE CHANGE MATERIAL-BASED DATA CENTER COOLING SYSTEM

BACKGROUND

Electronic components generate waste heat energy when in use. This heat energy should be removed to mitigate a potential for component overheating and subsequent malfunction. Computer systems typically include a number of such components, or waste heat sources, that include, but are not limited to, printed circuit boards, mass storage devices, power supplies, and processors. For example, one personal computer system may generate 100 watts to 150 watts of waste heat and some larger computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems.

Some known data centers include methods and apparatus configured to facilitate waste heat removal from a plurality of racking systems. Moreover, some known data centers include a plurality of racking systems that have a plurality of configurations that are non-uniform with respect to component density and usage such that each racking system generates waste heat at a non-uniform rate as compared to the remainder of the racking systems. In such data centers, application of uniform heat removal methods and apparatus to such non-uniform waste heat generation sources may not be fully efficient and effective in waste heat removal.

Some data centers use outside air as an important source of cooling air. The characteristics and quality of outside air may vary widely, however, even at a given location. Aside from the significant changes in temperature and humidity that can occur with the change of seasons, environmental quality of the outside air may vary due to a myriad of external factors. For example, smoke, smog, and airborne by-products of industrial and/or agricultural activities can all affect usability of outside air for cooling purposes. These variations over time in availability, cooling capacity, and quality of outside air create challenges in effectively sizing and operating cooling air systems for a data center.

From time to time, cooling systems in a data center fail. A failure of a cooling system may cause failure of the electrical systems being cooled. For example, servers in a rack may fail if the operating temperatures in the rack exceed acceptable limits. In some cases, computing systems may need to be taken off-line until a cooling system, resulting in a loss a computing capacity for the data center.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system and method for cooling electronic equipment in a data center are disclosed. According to one embodiment, a data center includes an air handling system and a thermal energy receptacle system. The air handling system moves air across heat producing components of electrical systems in the data center. The thermal energy receptacle system is coupled to the air handling system. The thermal energy receptacle system includes one or more heat exchangers that exchange heat between air moving through the air handling system and a fluid, one or more phase change material modules including phase change material, and a fluid transport system that transports fluid between the phase change material modules and the heat exchangers. The thermal energy receptacle system transfers heat from air passing over the one or more heat exchangers to at least one of the phase change material modules such that at least a portion of the phase change material changes phase (for example, melts).

According to one embodiment, a system includes an air handling system and a thermal energy receptacle system. The thermal energy receptacle system is coupled to the air handling system. The thermal energy receptacle system includes one or more phase change material modules. The thermal energy receptacle system transfers heat from air moving through the air handling system to the phase change material modules such that at least a portion of the phase change material changes phase.

According to one embodiment, a thermal energy receptacle system for a computing room of a data center includes one or more heat exchangers that exchange heat between air moving through the air handling system and a fluid, one or more phase change material modules, and a fluid transport system that transports fluid between the phase change material modules and the heat exchangers.

According to one embodiment, a method of removing heat from heat producing components in a data center includes moving air through a computing room in a data center. The air is moved across heat producing components of electrical systems in the data center. Air heated by the heat producing components is moved out of the computing room of a data center. Heat is transferred from the air to phase change material such that the temperature of the air moving through the data computing room is lowered.

As used herein, "phase change material element" means an element that includes one or more phase change materials. Examples of phase change elements include phase change material capsules, cells, or blocks, or combinations thereof (a phase change material element may be, for example, a stack, a brick, a string, or a ring of phase change material capsules).

As used herein, "phase change material module" means a module that includes phase change material. A phase change material module may include may include containers for holding phase change material, heat exchange elements, or both. A phase change material module can include any number of phase change material elements.

As used herein, "thermal energy receptacle system" means a system, device, apparatus, element, or combination thereof, that can receive thermal energy.

As used herein, "ambient" refers to a condition of outside air at the location of a system or data center. An ambient temperature may be taken, for example, at or near an intake hood of an air handling system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "computer room" means a room of a building in which computer systems, such as rack-mounted servers, are operated.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, a "free cooling mode" includes a mode of operation in which an air handling sub-system pulls air at least partially from an external source (such as air outside a facility) and forces the air to electronic equipment without active chilling in the air-handling sub-system (e.g., fluid flow through the chiller coils in the air handling sub-system is shut off by closing a flow control valve).

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

In various embodiments, a system for cooling components of electrical systems includes an air handling system and a thermal energy receptacle system. The thermal energy receptacle system may include phase change material modules. The thermal energy receptacle system can transfer heat from air moving the air handling system to the phase change material modules such that the phase of the phase change material changes (for example, melts).

Figure 1:
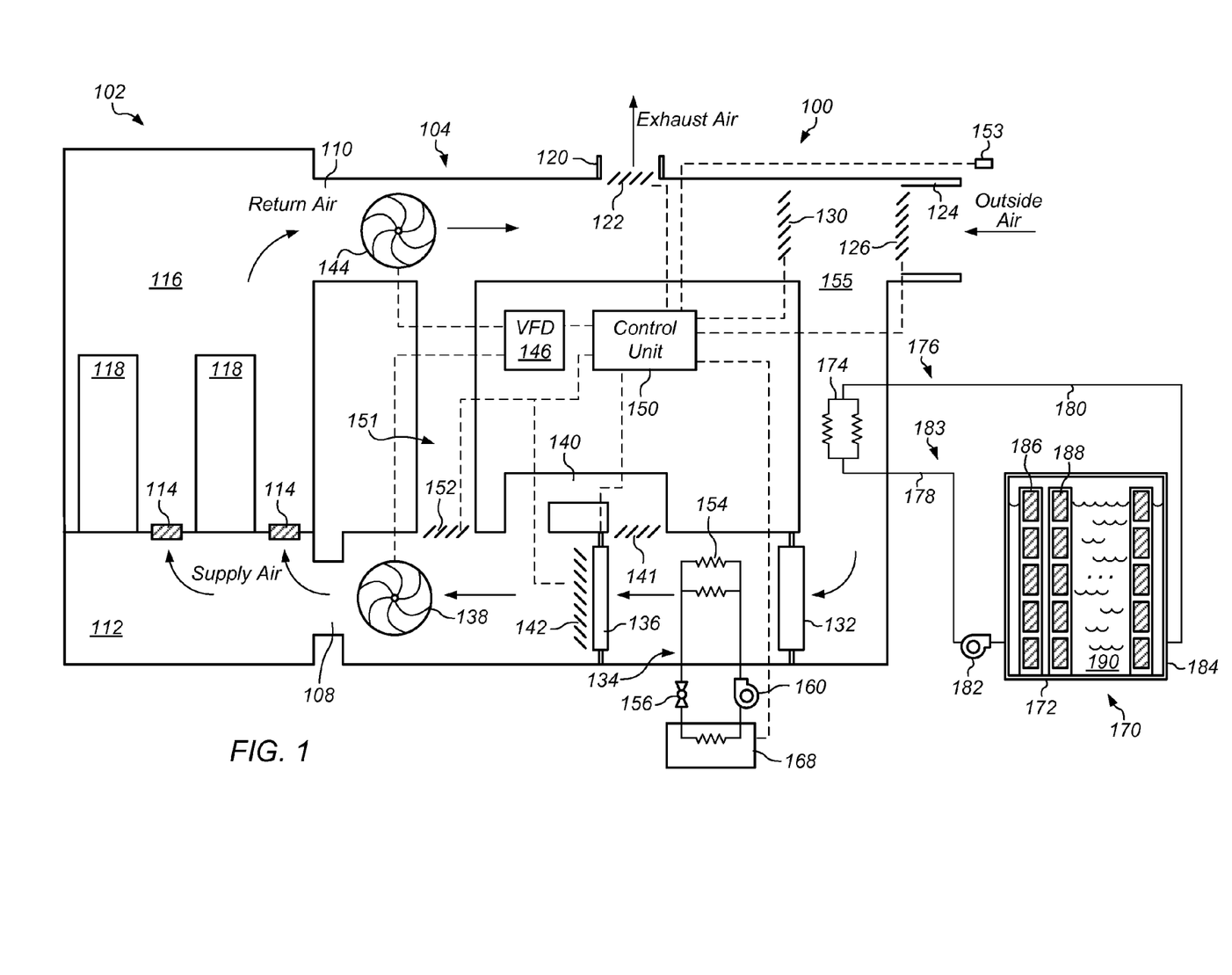
FIG. 1 is a schematic diagram illustrating one embodiment of a data center cooling system including a thermal energy receptacle system with a phase change material module.

FIG. 1 is a schematic view of an embodiment of a data center cooling system including a thermal energy receptacle system with a phase change material module. Cooling system 100 may remove heat from computing devices or other electrical systems operating in data center 102. In the embodiment illustrated in FIG. 1, cooling system 100 includes air handling sub-system 104. Air handling sub-system 104 may channel cooling air to data center 102.

The number of air handling sub-systems 104 in cooling system 100 may vary. In some embodiments, cooling system 100 includes many air handling sub-systems 104. In one embodiment, cooling system 100 may include four air handling sub-systems 104. In another embodiment, cooling system 100 includes only one air handling sub-system 104. In facilities with multiple air handling sub-systems and/or multiple data centers, cross-over ducts may be provided (e.g., on the supply side, the return side, or both) to allow cooling air from air handling sub-systems to be distributed and/or redirected within a data center or among data centers. Air handling sub-systems may be commonly controlled, separately controlled, or a combination thereof. In certain embodiments, only a sub-set of the total air handling sub-systems for a data center are provided with outside air vents. For example, half the air handling systems at a data center may have both outside air vents and return air vents, while the other half the air handling systems at a data center have only return air vents.

Each air handling sub-system 104 may be coupled to data center 102 by supply duct 108 and return duct 110. Cooling air may flow from air handling sub-system 104 through supply duct 108 into plenum 112. From plenum 112, cooling air may pass through flow restriction devices 114 into room 116. Cooling air may pass over racks 118. After the air is heated by racks 118, the air may pass through return duct 110. Air may be recirculated through one or more air handling sub-systems or discharged from the system through exhaust vent 120. Exhaust vent 120 includes exhaust damper 122.

Air for cooling system 100 may be drawn from outside air, recirculated air, or a combination of outside air and recirculated air. Air handling sub-system 104 includes outside air vent 124. Outside air vent includes outside air damper 126. Air handling sub-system 104 includes mixing air damper 130. Mixing plenum 155 is provided between mixing air damper 130 and outside air damper 126.

Cooling system 100 includes filter bank 132, chilled water sub-system 134, evaporative cooler 136, and supply fan 138, and return fan 144. In one embodiment, filter bank 132 includes a series of four filters. Cooling system 100 includes bypass duct 140. Bypass duct 140 may allow for all or a portion of the supply air to bypass evaporative cooler 136. Evaporative cooler bypass damper 141 and evaporative cooler face damper 142 may be selectively positioned to control flow through evaporative cooler 136. Cooling system 100 includes return air bypass 151 and return air bypass damper 152.

Supply fan 138 and return fan 144 are coupled to VFDs 146. VFD 146 is coupled to control unit 150.

Chilled water subsystem 134 is coupled in heat transfer communication with air handling sub-systems 104. Chilled water sub-system 134 includes coils 154 and valve 156. Valve 156 is coupled to control unit 150. Valve 156 may be opened and closed by signals from control unit 150. The position of valve 156 may be used to regulate the use of chilled water to cool air in air handling sub-system 104. In one embodiment, a common chilled water subsystem 134 provides chilled water to two more air handling sub-systems. In certain embodiments, each air handling sub-system is cooled by a dedicated chilled water subsystem 134.

Chilled water sub-system 134 includes at least one pump 160 coupled in flow communication with a flow control valve 156. Valve 156 is coupled in flow communication with coils 154 such that chilled water flow through coils 154 is facilitated while air flows across coils 154. Coils 154 are coupled in flow communication with at least one chilled water heat exchanger 162 via a plurality of tubes that are coupled in flow communication with pump 160.

Cooling system 100 further includes a chilled water heat removal sub-system 168. Heat removal sub-system 168 may be any sub-system that facilitates operation of system 100. In one embodiment, heat removal sub-system 168 is an air-conditioning refrigerant sub-system. In another embodiment, heat removal sub-system 168 is a cooling tower sub-system. In still another embodiment, heat removal sub-system 168 is a service water sub-system. In certain embodiments, a mechanical cooling system such as an air-conditioning refrigerant system may be in direct heat transfer communication with cooling air in air handling sub-systems 104. For example, evaporator coils of an air conditioning system may be positioned downstream from filter bank 132.

Control unit 150 may be programmed to control devices in air handling sub-systems 102, chilled water sub-systems 134, and/or heat removal sub-systems. Control unit 150 is coupled to supply fan 138, return fan 144, outside air damper 126, exhaust damper 122, and mixing air damper 130. Control unit 150 is in data communication with temperature sensors, humidity sensors, and pressures sensors. For example, control unit 150 is in data communication with temperature sensor 153 located near the intake hood of cooling system 100. In one embodiment, all of the air handling sub-systems and chilled-water sub-systems at a data center are controlled with a common control unit. In other embodiments, separate controllers are provided for each air handling sub-system and chilled water sub-systems, or for a subset of the air handling sub-systems and/or chilled water sub-systems. Devices in air handling sub-systems and chilled water sub-systems may be controlled automatically, manually, or a combination thereof.

In certain embodiments, control unit 150 includes at least one programmable logic controller. The PLC may, among other things, open and close dampers in air handling system 104 based upon command signals from an operator to channel air flow through data center 102 as necessary for the prevailing operational conditions. Alternatively, the PLC may modulate dampers between fully open and fully closed positions to modulate airflow.

Cooling system 100 also includes a plurality of temperature measurement devices that, in one embodiment, are thermocouples. Alternatively, the temperature measurement devices include, but not be limited to, resistance temperature detectors (RTDs) and any device that facilitate operation of cooling system 100 as described herein. For example, a chilled water thermocouple may be positioned within chilled water subsystem 138 to facilitate measuring a temperature of the chilled water upon discharge from a heat exchanger. In the one embodiment, such chilled water temperatures are controlled to approximately 5.6 degrees Celsius (° C.) (42 degrees Fahrenheit (° F.)).

In the embodiment shown in FIG. 1, air handling sub-system 104 may force air through supply duct 108 into plenum 112. In other embodiments, cooling air may be forced directly into room 116 through a supply duct without going through a plenum. In various embodiments, flow restriction devices 114 may be chosen to control the flow rates and distribution of cooling air among various racks 118 in room 116.

System 102 includes thermal energy receptacle system 170. Thermal energy receptacle system 170 includes phase change material module 172, receptacle heat exchanger 174, and fluid transport system 176.

Fluid transport system 176 includes supply line 178, return line 180, and pump 182. Supply line 178 may carry a fluid from receptacle heat exchanger 174 to phase change material module 172. Return line 180 may carry a fluid from phase change material module 172 to receptacle heat exchanger 174. Supply line 178, return line 180 phase change material module 172, and receptacle heat exchanger 174 form thermal energy receptacle loop 183. A liquid, such as water, may be circulated through thermal energy receptacle loop 183.

Phase change material module 172 includes container 184 and phase change material elements 186. Container 184 may be, for example, a tank. Phase change material 188 may be encapsulated in phase change material elements 186. In one embodiment, each of phase change material elements 186 is a column (for example, a stack) of phase change material cells. Phase change material elements 186 may be spaced within container 184. In some embodiments, phase change material elements 186 are arranged in an array or grid (for example, an arrangement of rows and columns.). Water 190 may fill container 184. Water 190 may be in thermal communication with phase change material elements 186. Water 190 may, for example, surround phase change material elements 186 such that water 190 is in direct contact with some or all of the cells in each of phase change material elements 186.

Thermal energy receptacle system 170 may receive heat from air moving through air handling system 104. Thermal energy receptacle system 170 may remove heat from heat producing components in computer room 116 (for example, components of servers in racks 118.) In some embodiments, thermal energy receptacle system 170 operates to remove heat from air any time that air is flowing through air handling system 104. In other embodiments, thermal energy receptacle system 170 can be selectively activated and deactivated (for example, by a control system). For example, control unit 150 may activate or deactivate thermal energy receptacle system 150 based on cooling needs for the electrical systems operating in racks 118. In one embodiment, thermal energy receptacle system 170 is activated to protect the system from a thermal overload condition (for example, a runaway thermal event after a failure of chilled water system 134).

When thermal energy receptacle system 170 is active in a cooling mode, liquid may be circulated through thermal energy receptacle loop 183. Pump 182 may be operated to move liquid through thermal energy receptacle loop 183. Heat may be transferred from air moving through air handling system 104 to the liquid circulating in thermal energy receptacle loop 183 via receptacle heat exchanger 174. Supply line 178 may carry heated liquid from receptacle heat exchanger 174 to container 184 of phase change material module 172. In container 184, heat may be transferred from liquid 190 in container 184 to phase change material 188. Some or all of phase change material 188 in phase change material elements 186 may change phase as a result of the heat transfer. For example, some or all of phase change material 188 may melt. Liquid in container 184 may be recirculated to receptacle heat exchanger 174 by way of return line 180. Melting of phase change material 188 may remove heat from air moving through air handling system 104. In this manner, thermal energy receptacle system 170 may provide cooling for systems in racks 118 in computer room 116.

When thermal energy receptacle system 170 is not needed for cooling, system 100 may be placed in a receptacle system re-charging mode. A recharging mode may include removing heat from phase change material in phase change material modules 172. In one example of a re-charging mode, heat is returned from thermal energy receptacle system 170 back into air moving through air handling system 104. As an example, air handling system 104 may be operated to move cold air across receptacle heat exchanger 174 as liquid is circulated through thermal energy receptacle loop 183. As the liquid circulates through thermal energy receptacle loop 183, heat may be transferred from the circulating liquid into the air moving across receptacle heat exchanger 174. Heat may be transferred from phase change material 188 in phase change material elements 186 into the liquid. As heat is transferred from phase change material 188, some or all of the phase change material may solidify. As the phase change material solidifies, capacity of thermal energy receptacle system 170 to receive heat may be increased and/or restored.

In some embodiments, a thermal energy receptacle system with phase change materials is operated to maintain temperatures in a data center within a desired range. In one embodiment, a thermal energy receptacle system with phase change materials is activated in response to a failure of a primary cooling system. For example, thermal energy receptacle system 170 may be activated in response to a failure in chilled water sub-system 134. As another example, thermal energy receptacle system 170 is operated in response to a failure of air conditioning system chilling water for use in chilled water sub-system 134.

In some embodiments, cool air for resolidifying phase change material in a thermal energy receptacle system is supplied from a mechanical cooling system in a data center. For example, in the system illustrated in FIG. 1, chilled water subsystem 134 may be operated to produce cold air. The cold air may pass over receptacle heat exchanger 174 to remove heat from liquid circulating in thermal energy receptacle loop 183. In certain embodiments, return air bypass damper 152 and dampers 130 are opened such that the cold air bypasses computer room 116 via return air bypass 151 and passes over receptacle heat exchanger 174.

In some embodiments, cool air for resolidifying phase change material in a thermal energy receptacle system is supplied from outside a data center. Outside air may be used, for example, when prevailing temperatures are low, such as in winter or at night. For example, in the system illustrated in FIG. 1, cold outside air may be drawn into air handling system 104 and across receptacle heat exchanger 174. In some cases, mechanical cooling may be turned off or deactivated during a re-charge of the phase change material modules. The cold air may pass over receptacle heat exchanger 174 to remove heat from liquid circulating in thermal energy receptacle loop 183. Heated air that has passed over receptacle heat exchanger 174 may be moved through the computer room 114 and then expelled from the system to outside via exhaust vent 120. In some cases, the heated air bypasses computer room 116 via return air bypass 151.

Phase change material for a phase change material module may be any of various suitable materials. As used herein, "phase change material" includes any material, or combination of materials, that can be used to store thermal energy as latent heat. Phase change materials may be organic, inorganic, or a combination thereof. Examples of phase change material include paraffinic materials, inorganic salts, and eutectic compounds. In some embodiments, a phase change material is encapsulated. In some embodiments, a phase change material is made of, or contained in, a slurry.

In various embodiments, operation of one or more air handling sub-systems of a cooling system is controlled in response to one or more conditions. For example, a controller may be programmed to switch the air source for an air-handling sub-system from return air to outside air when one or more predetermined conditions are met, such as temperature and humidity. In some embodiments, heat transfer between air in a data center and phase change material is controlled based on conditions of one or more measured characteristics of air in a data center.

In various embodiments, a cooling system for a data center may be operated in two or more different modes. The mode of operation at any given time may be selected based on characteristics of the outside air, characteristics of air in various locations in the cooling system, and other characteristics prevailing at or near the data center. In various embodiments, the multi-mode cooling system may minimize the amount of energy required to cool a data center. The multi-mode system may allow for a more efficient use of components of a cooling air system, allow for a reduction is size/capacity of one or more elements of the system, reduce operating costs of a cooling system, and/or improve cooling effectiveness (such as through lower operating temperatures of computer systems in the data center).

In some embodiments, air flowing through a phase change material module is a mixture of air returned from a computing room of a data center and outside air. In one embodiment, the mixture is controlled based on conditions in a data center. For example, if the air temperature being returned from a data center is hot but the outside air is cold, a larger proportion of outside air may be mixed with the return air to achieve a desired air temperature for recharging phase change material modules.

In the embodiment illustrated in FIG. 1, only one phase change material module is shown for illustrative purposes. A system may nevertheless include, in various embodiments, any number of thermal energy receptacle systems, receptacle loops, and phase change material modules.

Each phase change material module may include any number of phase change material elements. In some embodiments, phase change material elements are arranged in an array or grid (for example, 6 cells wide by 8 cells long by 10 cells high).

In the embodiment illustrated in FIG. 1, heat may be rejected to a phase change material module via a fluid loop that includes a heat exchanger in fluid communication with air moving through the data center. Heat may, nevertheless, in various embodiments be transferred from moving air to a phase change material module without a fluid loop (for example, directly from moving air to a housing of a phase change material module). In some embodiments, a container of a phase change material module is located in contact with air moving through an air handling system. For example, a tank of water including phase change material elements may be located in a intake duct or an exhaust duct. In some embodiments, a phase change material module includes fins, pins, or other elements to promote heat transfer from moving air to phase change material in the module.

Although in the embodiment illustrated in FIG. 1, the receptacle heat exchanger is upstream from the chilled water system, a receptacle heat exchanger for phase change material cooling may be other locations. For example, in one embodiment, a thermal energy receptacle system with phase change material modules is downstream from a mechanical cooling system.

Figure 2:
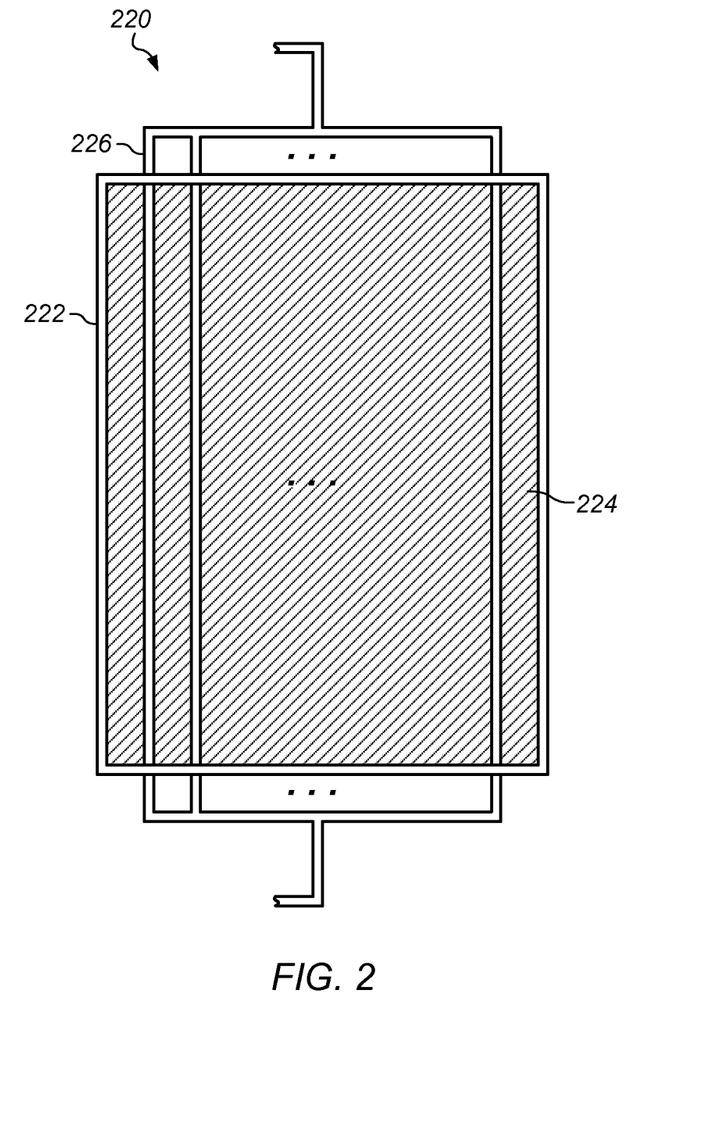
FIG. 2 illustrates one embodiment of a phase change material module having pipes for passing fluid over phase change material.

In some embodiments, fluid is passed over a phase change material through pipes, tubes, or coils. FIG. 2 illustrates one embodiment of a phase change material module having pipes for passing a fluid over phase change material. Phase change material module 220 includes container 222. Bed 224 of phase change material is held in container 222. Pipes 226 pass through bed 224 of phase change material.

In some embodiments, fluid carriers (such as pipes 226 illustrated in FIG. 2) include elements to promote heat transfers, such as fins, pins, or ribs. In some embodiments, fluid carriers are in the form one or more coils. Coils for transferring heat between a fluid and phase change material may have any suitable geometry, such as straight, undulating, of helical. In some embodiments, fluid carriers are arranged in an array or pattern (for example, a 10 by 10 cluster of pipes).

Figure 3:
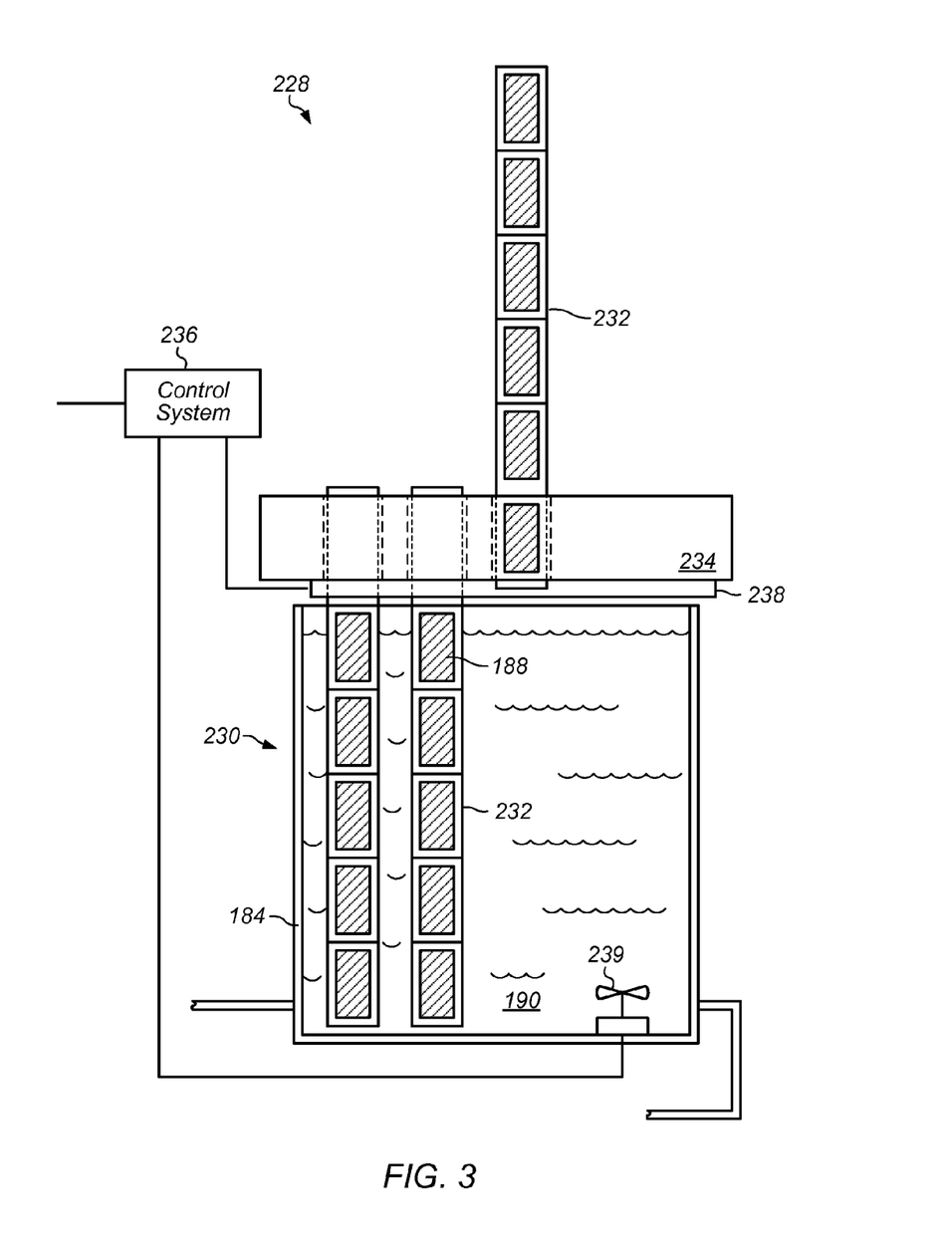
FIG. 3 illustrates one embodiment of a phase change material module having phase change material elements that can be selectively activated.

In some embodiments, the amount of phase change material that is active for cooling a system is variable. In certain embodiments, a control system is operated to change the amount of phase change material that is active. FIG. 3 illustrates one embodiment of a phase change material module having phase change material elements that can be selectively activated. System 228 includes phase change material module 230. Phase change material module 230 includes container 184, phase change material rods 232, phase change material rod carrier 234, and control system 236. Phase change material rods 232 are carried on rod carrier 234. Each of phase change material rods 232 includes phase change material 188. Phase change material rods may be selectively placed into contact with liquid 190.

Liquid 190 may be moved through container 184 in a manner similar to that described above relative to FIG. 1. Stirrer 239 is coupled to control system 236. Stirrer 239 may be operated to stir liquid 190 to promote heat transfer between phase change material rods 232 and liquid 190.

Rod positioning mechanism 238 is coupled to rod carrier 234 and control system 236. Control system 236 may control rod positioning mechanism 238 to raise and lower phase change material rods 232 into or out of liquid 190. By raising and lowering phase change material rods 232, the rate and amount of heat transfer between phase change material rods 232 and liquid 190 may be adjusted.

Figure 4:
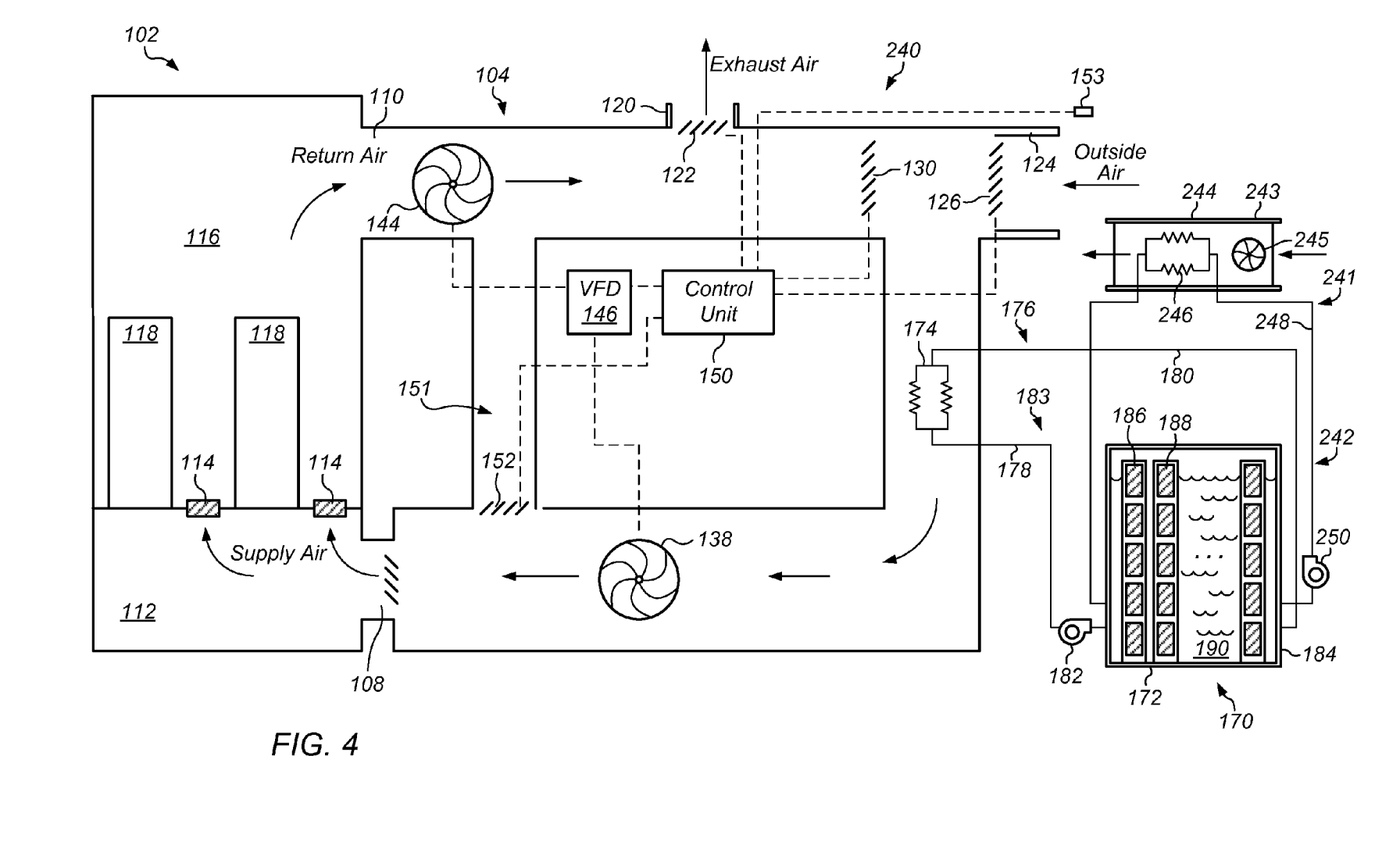
FIG. 4 illustrates one embodiment of system having a thermal energy receptacle system with an outside air loop.

In some embodiments, a thermal energy receptacle system with a phase change material includes an outside air loop. The outside air loop may be used to re-charge the thermal energy receptacle system. FIG. 4 illustrates one embodiment of system having a thermal energy receptacle system with an outside air loop. System 240 includes air handling system 104 and thermal energy receptacle system 242. Thermal energy receptacle system 241 includes phase change material module 170, fluid loop 242, and roof system 243. Roof system 243 includes tunnel 244, blower 245, and heat exchanger 246. Heat exchanger 246 is coupled to phase change material module 170 via fluid lines 248. Pump 250 may pump a fluid, such as water, through fluid loop 242. Pump 250 may be coupled to a controller, such as control unit 150.

Thermal energy receptacle system 242 may be operated in a manner similar to that described above relative to FIG. 1 to remove heat from air moving through air handling system 104. In some embodiments, thermal energy receptacle system 242 is operated to remove heat from heat producing components in rack systems 118.

Blower 245 may be coupled to a controller (for example, controller 150) via a variable fan drive (for example, VFD 245). Blower 245 may move air through tunnel 244. Pump 250 and blower 245 may be operated to promote heat exchange between outside air and phase change material in phase change material modules 170.

In some embodiments, pump 250 and blower 245 are operated a recharge mode. Heat from phase change material 188 may be transferred to fluid circulating fluid loop 242. Heat from the fluid in fluid loop 242 may be transferred to outside air via heat exchanger 246.

In the embodiment illustrated in FIG. 4, heat may be rejected from a phase change material module by way of fluid loop that includes a heat exchanger in fluid communication with outside air. Heat may, nevertheless, in various embodiments be rejected from a phase change material module without a fluid loop (for example, directly from a housing of the phase change material module to outside air). In some embodiments, a container of a phase change material module is located in contact with outside air. For example, a tank of water including phase change material elements may be located on the exterior of a building (such as on the roof of the building), or in a stand-alone structure. Heat may be conducted from the container to the air. In some embodiments, a phase change material module includes fins, pins, or other elements to promote heat transfer out of the phase change material.

Figure 5:
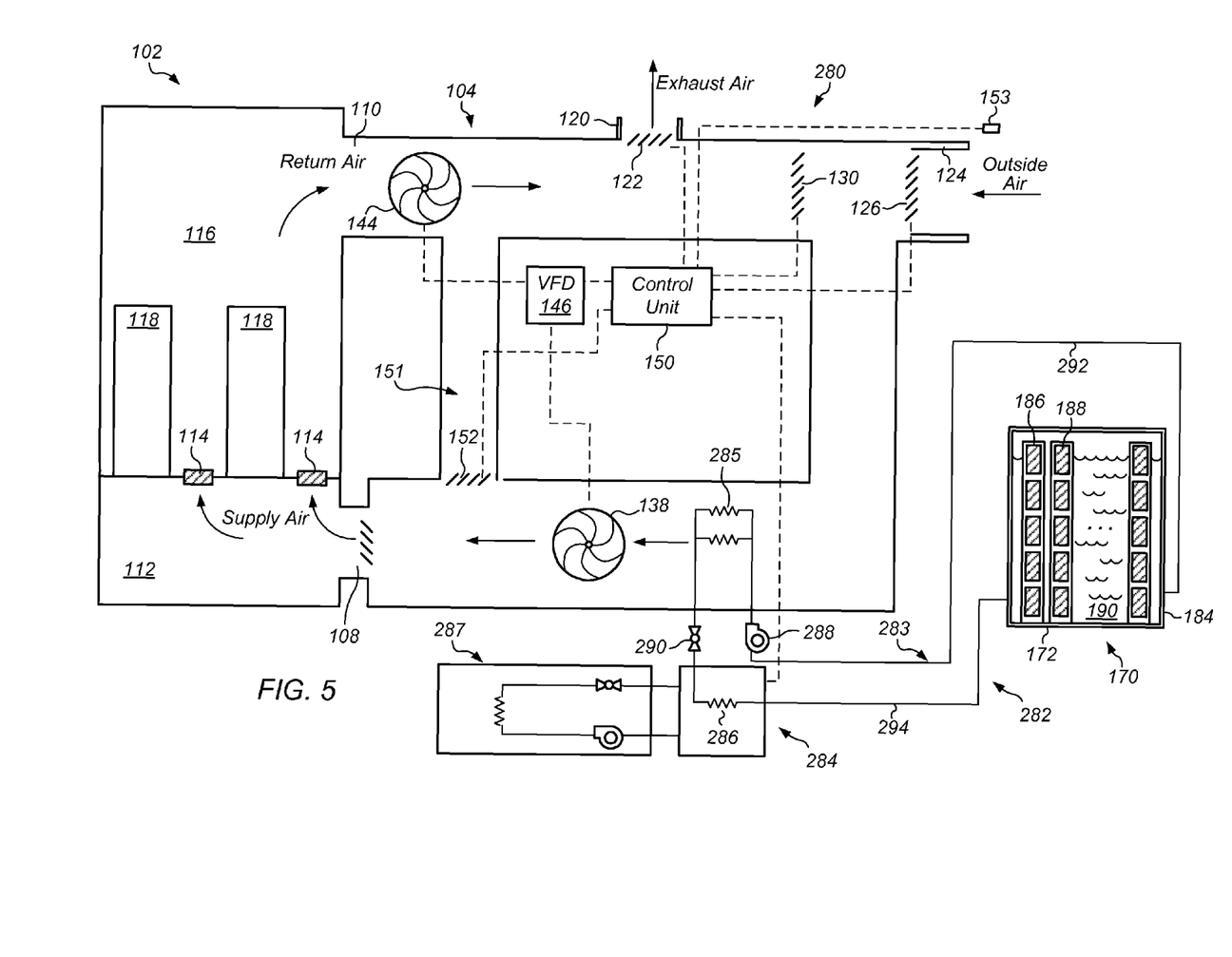
FIG. 5 illustrates one embodiment of a system that includes a phase change material module in a loop with a chilled water sub-system.

In some embodiments, phase change material modules are included in a loop with one more cooling systems, such as a chilled water sub-system. FIG. 5 illustrates one embodiment of a system that includes a phase change material module in a loop with a chilled water sub-system. System 280 includes air handling system 104 and thermal energy receptacle system 282. Thermal energy receptacle system 282 is coupled with air handling system 104 by way of water loop 283. Water loop 283 includes chilled water sub-system 284, heat exchanger 285, and phase change material module 170. Phase change material module 170 may be similar to that described above relative to FIG. 1.

Water in chilled water subsystem 284 may flow through heat exchanger 286. Water flowing through chilled water subsystem 284 may be coupled to heat removal system 287.

Heat removal system 287 may be operable to chill water passing through heat exchanger 286. Heat removal sub-system 287 may be any sub-system that removes heat from water in water loop 283. In one embodiment, heat removal sub-system 287 is an air-conditioning refrigerant sub-system. In another embodiment, heat removal sub-system 287 is a cooling tower sub-system. In still another embodiment, heat removal sub-system 287 is a service water sub-system. In certain embodiments, a mechanical cooling system such as an air-conditioning refrigerant system may be in direct heat transfer communication with cooling air in air handling sub-systems 104.

Control unit 150 may be coupled to pump 288, valve 290, and cooling system 287. Control unit 150 may be operated to control flow through water loop 283. Control unit 150 may be operated to remove heat from water flowing through water loop 283. Heat may be removed from air via heat exchanger 285.

In some embodiments, heat removal system 287 is operated in a re-charging mode in which chilled water passing through water loop 283 solidifies phase change material 188 in phase change material module 170. With some or all of phase change material 188 solidified, thermal energy receptacle system 282 may be operated to remove heat from air moving through air handling system 104 (for example, via heat exchanger 285). In some embodiments, heat removal system 287 is turned off while thermal energy receptacle system 282 removes heat from air moving through air handling system 104.

Figure 6:
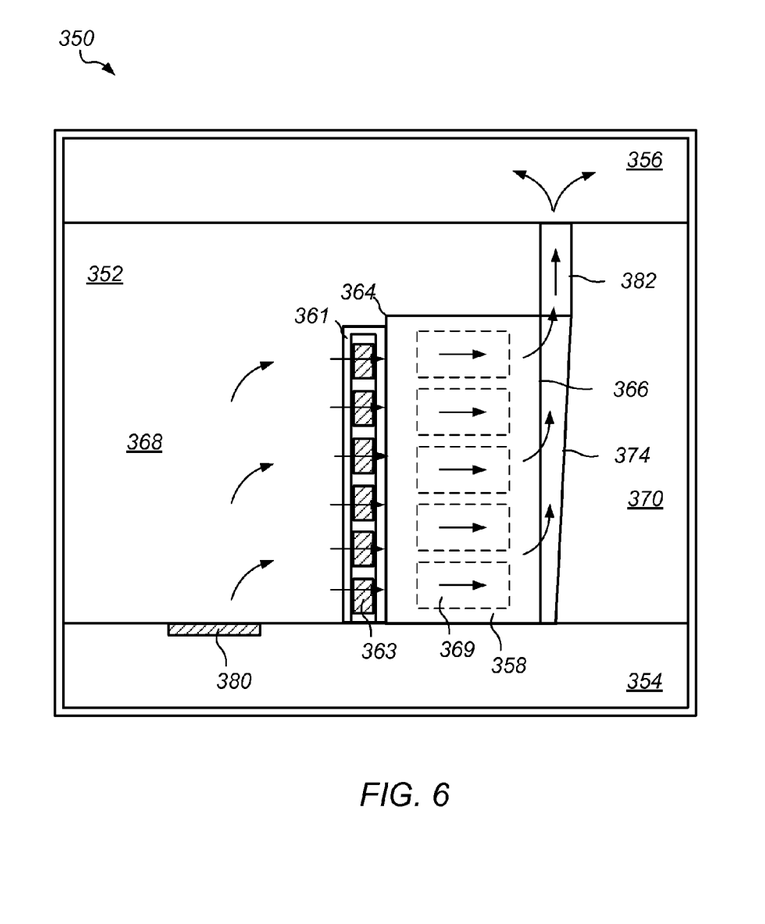
FIG. 6 illustrates a schematic view of one embodiment of a data center including a phase change material module coupled to a rack system.

In some embodiments, phase change material is used to provide cooling for a particular rack system. FIG. 6 illustrates a schematic view of one embodiment of a data center including a phase change material module coupled to a rack system. Data center 350 includes computer room 352, subfloor chamber 354, and plenum 356. Computer room 352 includes a row of one or more rack systems 358. Rack systems 358 include front side 364 and back side 366. Phase change material modules 361 are coupled to rack systems 358. Phase change material modules 361 include phase change material 363.

Rack systems 358 include servers 369. One of air directing devices 374 is coupled to each of rack systems 358 on backside 366 of the row. Servers 369 in rack systems 358 are cooled by passing air through phase change material modules 361 and from front to back of the row.

Air drawn from front aisle 368 passes through phase change material module 361, through servers 269, out the back of rack system 358, and into air directing device 274. Air directing device 274 may direct heated air from the rack system into duct 382. Duct 382 may channel heated air into plenum 356.

In some embodiments, a phase change material module pre-cools air before it is used to cool heat producing systems. For example, in the embodiment illustrated in FIG. 6, as air passes through phase change material module 361, some or all of phase change material 363 in phase change material modules 361 may melt, removing heat from the air before it passes through severs 369.

In some embodiments, phase change material modules included in a computing room on a rack-by-rack basis. Phase change material modules are provided, for example, on some but not all of the racks in a computing room. For example, a phase change material module may be included on each of two or more mission critical racks, but not included on other racks in the computing room. In certain embodiments, a phase change material module is included on each rack in a computing room.

In some embodiments, cool air may be passed through phase change material module 361 to re-charge the module, in a manner similar to that described above relative to FIG. 1. Cool air for recharging a phase change material module may be provided from a mechanical cooling system, outside air, or a combination thereof.

In the embodiment illustrated in FIG. 6, phase change material modules are located upstream from servers 369. A phase change material module may, however, be located downstream from heat producing components. In the case of a downstream module, melting of phase change material may remove heat from air being exhausted from a rack, thereby reducing the temperature of the exhaust air. In certain embodiments, air may be recirculated through a phase change material module, heat producing components, or both. In certain embodiments, a control system may module to control cooling by the phase change module.

In the embodiment illustrated in FIG. 6, heat is transferred from the air to phase change materials. A rack-level cooling system may nevertheless, in some embodiments, use other fluids to transfer heat from heat producing components to phase change material. In certain embodiments, a system includes an intermediate fluid, such as water circulating through heat exchanger coils that can reject heat to air.

Figure 7:
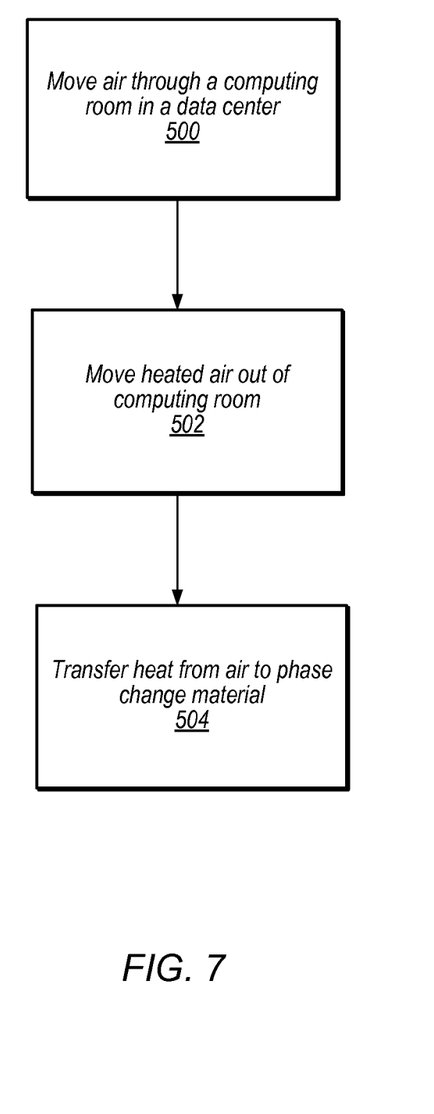
FIG. 7 illustrates one embodiment of removing heat from heat producing components in a data center.

FIG. 7 illustrates one embodiment of removing heat from heat producing components in a data center. At 500, air is moved through a computing room in a data center. The air is moved across heat producing components of electrical systems in the data center. In one embodiment, the air is moved through servers in racks.

At 502, air heated by the heat producing components is moved out of a computing room of a data center. For example, the heated air may be expelled from racks and vented through the ceiling of a computing room.

At 504, heat is transferred from air moving through the data center to a phase change material. In some embodiments, heat is transferred from air to phase change material by way of an intermediate fluid, such as water. In other embodiments, heat is transferred from air to phase change material by way of an intermediate fluid. Removal of heat from air may result in lower operating temperatures of electrical systems (such as servers) in a data center.

In some embodiments, a thermal energy receptacle system with phase change modules is operated as a supplemental cooling system, a back-up system, or both. For example, in the system illustrated in FIG. 1, thermal energy receptacle system may provide supplemental cooling to prevent a thermal overload condition in a computing room. In certain embodiments, a phase change material module is activated when a measured temperature (for example, exhaust air temperature as reported from a temperature probe) exceeds a predetermined limit. In some embodiments, the amount or rate of heat transfer is controlled based on measured characteristics of air in a data center. In one embodiment, thermal energy receptacle system is activated (for example, by control unit 150) in response to a failure of a primary cooling system (for example, a mechanical cooling system).

In some embodiments, phase change material modules are recharged after they have been used to remove heat from electrical systems in a data center. During a recharge, the phase change material may be cooled such that it re-solidifies. Cooling air for re-solidifying the phase change material may be provided from mechanical cooling, outside air, or a combination thereof. In some embodiments, re-solidifying phase change material is carried out when temperatures outside of a data center are relatively cold, such as at nighttime or on a cold day.

In certain embodiments, a control system is operated to selectively transfer heat between air used to cool electrical systems and phase change material modules. In some embodiments, a control system controls heat transfer to a thermal energy receptacle system on a periodic basis. The control system may operate, for example, according to a daily cycle. For example, thermal energy removal system 170 may be operated to remove heat during the day time when outside air temperature are high, and then recharged or deactivated when outside air temperatures are relatively low.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
    an air handling system configured to move air across heat producing components of electrical systems in the data center; and
    a thermal energy receptacle system coupled to the air handling system, wherein the thermal energy receptacle system comprises:
        one or more phase change material modules, at least one of the one or more phase change materials modules comprising:
        a container; and
        an arrangement of a plurality of phase change material elements spaced within the container, wherein each of the plurality of phase change material elements contains phase change material; and
        a fluid transport system configured to transport fluid between the one or more phase change material modules and one or more heat exchangers, wherein the one or more heat exchangers are in fluid communication with air moving through the air handling system, wherein the fluid of the fluid transport system flows through the one or more heat exchangers, and wherein heat is exchanged from the air moving through the air handling system to the fluid of the fluid transport system flowing though the one or more heat exchangers to cool the air moving through the air handling system; and
    wherein the thermal energy receptacle system is configured to transfer heat from air passing over the one or more heat exchangers to at least one of the phase change material modules such that at least a portion of the phase change material changes phase.

2. The data center of claim 1, wherein at least one of the phase change material modules comprises:
    one or more containers configured to hold at least a portion of the fluid; and
    one or more of the phase change material elements at least partially in the one or more containers, wherein the one or more phase change material elements are configured to receive heat from at least a portion of the fluid in the one or more containers.

3. The data center of claim 1, further comprising a control system configured to control transfer of heat between the air moving through the air handling system and at least a portion of the phase change material.

4. The data center of claim 1, wherein thermal energy receptacle system is configured to increase removal of heat from the air moving through the air handling system when one or more measured air temperatures in or near the data center are above a predetermined threshold.

5. A system, comprising:
    an air handling system configured to move air across heat producing components of electrical systems; and
    a thermal energy receptacle system coupled to the air handling system, wherein the thermal energy receptacle system comprises one or more phase change material modules comprising:
        a container, and
        an arrangement of a plurality of phase change material elements spaced within the container, wherein each of the plurality of phase change material elements contains phase change material, and
    a fluid transport system configured to transport a fluid between the one or more phase change material modules and one or more heat exchangers;
    wherein the one or more heat exchangers are in fluid communication with the air moving through the air handling system, wherein the fluid of the fluid transport system flows through the one or more heat exchangers, and wherein heat is exchanged from the air moving through the air handling system to the fluid of the fluid transport system flowing though the one or more heat exchangers to cool the air moving through the air handling system; and
    wherein the thermal energy receptacle system is configured to transfer heat from the air moving through the air handling system to at least one of the phase change material modules such that at least a portion of the phase change material changes phase.

6. The system of claim 5, wherein at least one of the phase change material modules is configured to receive heat from the fluid such that at least the portion of the phase change material melts.

7. The system of claim 6, wherein the fluid transported between the air moving through the air handling system and at least of the one or more phase change material modules comprises air.

8. The system of claim 6, wherein the fluid transported between the air moving through the air handling system and at least one of the one or more phase change material modules comprises a liquid.

9. The system of claim 6, wherein the thermal energy receptacle system comprises a pump configured to move the fluid over at least some of the phase change material elements.

10. The system of claim 6, wherein at least one of the one or more phase change material modules comprises:
    one or more of the containers configured to hold the fluid; and
    one or more of the phase change material elements comprising phase change material, wherein the phase change material elements are configured to receive heat from at least a portion of the fluid in the one or more containers.

11. The system of claim 6, wherein at least one of the phase change material modules comprises one or more tubes configured to transport the fluid over at least some of the phase change material elements.

12. The system of claim 6, wherein thermal energy receptacle system comprises the one or more heat exchangers configured to exchange the heat between the air moving through the air handling system and at least a portion of the fluid.

13. The system of claim 6, wherein thermal energy receptacle system comprises the one or more heat exchangers configured to exchange the heat between outdoor air and at least a portion of the fluid.

14. The system of claim 5, further comprising a control system configured to control transfer of heat between the air moving through the air handling system and at least a portion of the phase change material.

15. The system of claim 14,
wherein the system is configured to be deployed within a data center, and
wherein the control system is configured to:
sense at least one of characteristic of air in or near the data center; and
change a rate of transfer of heat from the air to the phase change material based on predetermined characteristics of the air.

16. The system of claim 15, wherein the control system is configured to increase heat removal by the thermal energy receptacle system from air moving in the data center when an air temperature is above a predetermined level.

17. The system of claim 14, wherein the control system is configured to add or remove one or more of the phase change material elements from thermal communication with one or more fluids.

18. The system of claim 14, wherein control system is configured control the thermal energy receptacle system based on a periodic cycle.

19. The system of claim 5, wherein the air handling system further comprises one or more mechanical cooling systems configured to remove heat from the air moving through the air handling system.

20. The system of claim 5, wherein the system comprises a data center, wherein the data center comprises one or more computing rooms, wherein at least some of the heat producing components are in the computing room, wherein the system further comprises a mixing plenum configured to mix outside air with air returned from at least one of the one or more computing rooms of the data center, wherein the thermal energy receptacle system is configured to exchange heat with air mixed in the mixing plenum.

21. The system of claim 5, wherein the air handling system is configurable to receive heat from the fluid such that at least a portion of the phase change material solidifies.

22. The system of claim 5, further comprising a chilled water system, wherein the chilled water system is configurable to remove heat from at least one of the phase change material modules.

23. The system of claim 5, wherein at least one of the one or more phase change material modules comprises one or more of the containers configured to hold one or more phase change material elements, wherein at least at a portion of at least one of the containers is in fluid communication with outside air, wherein the at least one of the containers is configured to reject at least a portion of the heat in the phase change material elements to the outside air.

24. A thermal energy receptacle system for a computing room of a data center, comprising:
one or more phase change material modules, wherein at least one of the one or more phase change material modules comprises:
a container; and
an arrangement of a plurality of phase change material elements spaced within the container, wherein each of the plurality of phase change material elements contains phase change material; and
a fluid transport system configured to transport a fluid between the one or more phase change material modules and one or more heat exchangers;
wherein the one or more heat exchangers are in fluid communication with air moving through an air handling system, wherein the fluid of the fluid transport system flows through the one or more heat exchangers, and wherein heat is exchanged from the air moving through the air handling system to the fluid of the fluid transport system flowing though the one or more heat exchangers to cool the air moving through the air handling system, and
wherein at least some of the heat transferred from the air to the fluid of the fluid transport system is further transferred to at least some of the one or more phase change material modules such that phase change material of the at least some phase change material modules changes phase.

25. A method of removing heat from heat producing components in a data center, comprising:
moving, via an air handling system, air through a computing room in the data center, wherein at least a portion of the air is moved across heat producing components of electrical systems in the data center;
moving, via the air handling system, air heated by the heat producing components out of the computing room of the data center; and
transferring heat from at least a portion of the air in the data center to phase change material in a phase change material module such that a temperature of the air in a least a portion of the computing room is lowered, wherein transferring heat comprises:
moving the air, via the air handling system, across one or more heat exchangers of the air handling system, the heat exchanges in fluid communication with the air moving through the air handling system, and
transporting fluid of a fluid transport system through the one or more heat exchangers,
wherein heat is exchanged from the air moving through the air handling system to the fluid of the fluid transport system flowing though the one or more heat exchangers to cool the air moving through the air handling system, and
wherein at least some of the heat transferred from the air to the fluid of the fluid transport system is further transferred to at least some of the phase change material such that phase change material changes phase.

26. The method of claim 25, wherein transferring the heated air to phase change material comprises:
transferring the heat from the heated air to the fluid; and
transferring the heat from the at least a portion of the fluid to the phase change material.

27. The method of claim 25, wherein transfer of the heat in the air to the phase change material is in response to detecting a thermal condition exceeding a predetermined level.

28. The method of claim 25, further comprising transferring at least a portion of the heat from the phase change material to the air to solidify at least a portion of the phase change material.

29. The method of claim 28, wherein transferring the portion of the heat from the phase change material to the air to solidify at least a portion of the phase change material comprises mechanically cooling the air.

30. The method of claim 28, wherein transferring the portion of the heat from the phase change material to the air to solidify at least a portion of the phase change material comprises rejecting the portion of the heat to outside air.

31. The method of claim 25, wherein transferring the heat from the air to the phase change material comprises moving one or more phase change material elements to place at least one of the phase change material elements into thermal communication with the fluid.

* * * * *